(12) United States Patent
Yan et al.

(10) Patent No.: US 9,768,096 B2
(45) Date of Patent: Sep. 19, 2017

(54) MOBILE TERMINAL

(71) Applicant: HUAWEI DEVICE CO., LTD., Shenzhen (CN)

(72) Inventors: Longping Yan, Shanghai (CN); Konggang Wei, Shenzhen (CN); Hualin Li, Shanghai (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 15/123,484

(22) PCT Filed: Mar. 20, 2014

(86) PCT No.: PCT/CN2014/073784
§ 371 (c)(1),
(2) Date: Sep. 2, 2016

(87) PCT Pub. No.: WO2015/139271
PCT Pub. Date: Sep. 24, 2015

(65) Prior Publication Data
US 2017/0077010 A1    Mar. 16, 2017

(51) Int. Cl.
*H01L 23/427* (2006.01)
*H01L 21/48* (2006.01)
*H01L 23/367* (2006.01)

(52) U.S. Cl.
CPC ........ *H01L 23/427* (2013.01); *H01L 21/4882* (2013.01); *H01L 23/3675* (2013.01); *H01L 2924/0002* (2013.01)

(58) Field of Classification Search
CPC ............... H01L 23/427; H01L 23/3675; H01L 21/4882; F28D 15/0275
See application file for complete search history.

(56) References Cited

U.S. PATENT DOCUMENTS

| | | |
|---|---|---|
| 5,268,812 A | 12/1993 | Conte |
| 6,111,750 A | 8/2000 | Gates |
| 6,122,167 A | 9/2000 | Smith et al. |
| 2007/0051498 A1 | 3/2007 | Xia et al. |

(Continued)

FOREIGN PATENT DOCUMENTS

| | | |
|---|---|---|
| CN | 1925143 A | 3/2007 |
| CN | 101374395 A | 2/2009 |
| CN | 101384152 A | 3/2009 |

(Continued)

OTHER PUBLICATIONS

International Search Report and Written Opinion of the International Search Authority (including English translation) issued in corresponding International Application No. PCT/CN2014/073784, mailed Dec. 24, 2014, 19 pages.

(Continued)

*Primary Examiner* — Ermias Woldegeorgis
(74) *Attorney, Agent, or Firm* — Quarles & Brady LLP

(57) ABSTRACT

A mobile terminal is provided. The mobile terminal includes a circuit board, where a chip is disposed on a first surface of the circuit board. A groove is provided on a second surface of the circuit board. The mobile terminal further includes: a heat pipe that is disposed in the groove. One end of the heat pipe extends to a side wall of the circuit board or outside a side wall of the circuit board.

12 Claims, 3 Drawing Sheets

(56) References Cited

U.S. PATENT DOCUMENTS

| | | | | |
|---|---|---|---|---|
| 2007/0108599 A1* | 5/2007 | Im | ...................... | H01L 23/142 |
| | | | | 257/712 |
| 2013/0284406 A1* | 10/2013 | Kawasaki | ............ | B22D 23/003 |
| | | | | 165/104.26 |

FOREIGN PATENT DOCUMENTS

| | | |
|---|---|---|
| CN | 202362724 U | 8/2012 |
| EP | 0529837 A1 | 3/1993 |
| EP | 0911418 A1 | 5/1999 |
| JP | H0325991 A | 2/1991 |
| JP | H06244576 A | 9/1994 |
| JP | H1168371 A | 3/1999 |

OTHER PUBLICATIONS

Extended European Search Report issued in corresponding EP Application No. 14886216, dated Feb. 2, 2017, 7 pages.

\* cited by examiner

MOBILE TERMINAL

CROSS-REFERENCE TO RELATED APPLICATION

This application is a National Stage of International Application No. PCT/CN2014/073784, filed on Mar. 20, 2014, which is hereby incorporated by reference in its entirety.

TECHNICAL FIELD

The present invention relates to the field of terminal technologies, and in particular, to a mobile terminal.

BACKGROUND

Currently, as mobile terminals such as mobile phones and wireless wide area network cards become more popular and are developing towards a trend of higher intelligence, higher integration and more powerful functions, chips used in the mobile terminals run at increasingly high clock rates, so that the chips may have a more powerful data processing capability. With constant advancement of chip technologies, chips generate more heat in a working process, bringing more challenges to a thermal design for terminals.

In the prior art, a heat-conducting layer is generally disposed between a chip and a shielding case of the chip. Heat generated by the chip is conducted to the shielding case by the heat-conducting layer, and is then dissipated by means of a heat conduction effect of the shielding case that is made of a metal, thereby achieving heat dissipation of the chip and lowering a temperature around the chip.

During implementation of the present invention, the inventor finds that, limited by sizes and heat-conducting performance of a thermal pad and the shielding case, a heat dissipation effect of the chip is not satisfactory.

SUMMARY

A technical problem to be resolved by the present invention is to provide a mobile terminal which can improve a heat dissipation effect of a chip and lower a temperature of the chip.

To resolve the foregoing technical problem, the following technical solution is used in a mobile terminal provided by the present invention:

A mobile terminal includes a circuit board, where a chip is disposed on a first surface of the circuit board, a groove is provided on a second surface of the circuit board, and the mobile terminal further includes:

a heat pipe, where one end of the heat pipe is embedded in the groove, and an other end of the heat pipe protrudes from a side wall of the circuit board or is flush to a side wall of the circuit board.

In a first possible implementation manner, the groove extends to below the chip, so that one end of the heat pipe extends to below the chip.

In a second possible implementation manner, a depth of the groove is less than or equal to half a thickness of the circuit board.

With reference to the first possible implementation manner, in a third possible implementation manner, the mobile terminal further includes:

a thermal pad, located in the groove, where the thermal pad is located between the chip and the heat pipe.

In a fourth possible implementation manner, the heat pipe has a rectangular section.

In a fifth possible implementation manner, the mobile terminal further includes: a shielding case, located on the circuit board and wrapping the chip.

In a sixth possible implementation manner, the mobile terminal further includes: a housing, wrapping the heat pipe, the shielding case, the chip, and the circuit board.

In the technical solution of embodiments of the present invention, the chip is disposed on the first surface of the circuit board in the mobile terminal, the groove is provided on the second surface of the circuit board, the heat pipe is disposed in the groove, and one end of the heat pipe extends to the side wall of the circuit board or outside the side wall of the circuit board, so that heat generated by the chip can be conducted to outside the circuit board through the heat pipe. In this way, a temperature around the chip can be effectively lowered, thereby lowering a temperature of the entire mobile terminal. In addition, a leakage current is reduced, and power consumption of the chip is reduced, thereby further reducing power consumption of the entire mobile terminal.

DESCRIPTION OF EMBODIMENTS

The following clearly and completely describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

Figure 1:
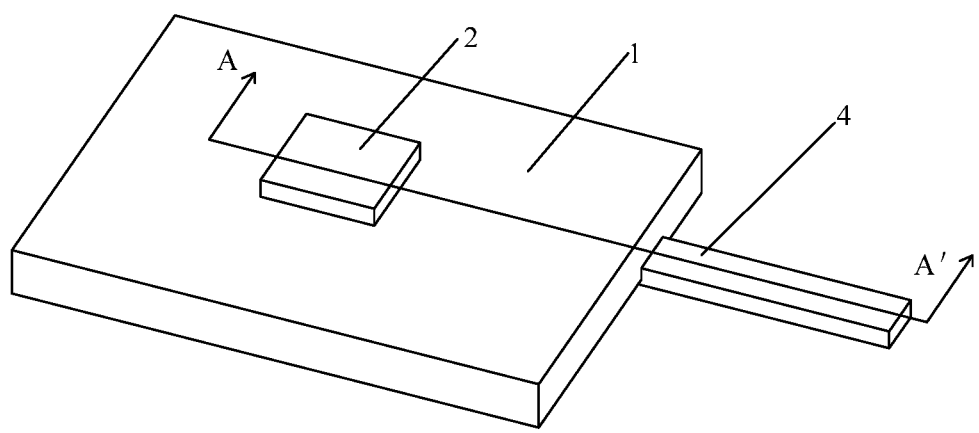
FIG. 1 is a first schematic diagram of an internal structure of a mobile terminal according to an embodiment of the present invention.
Figure 3:
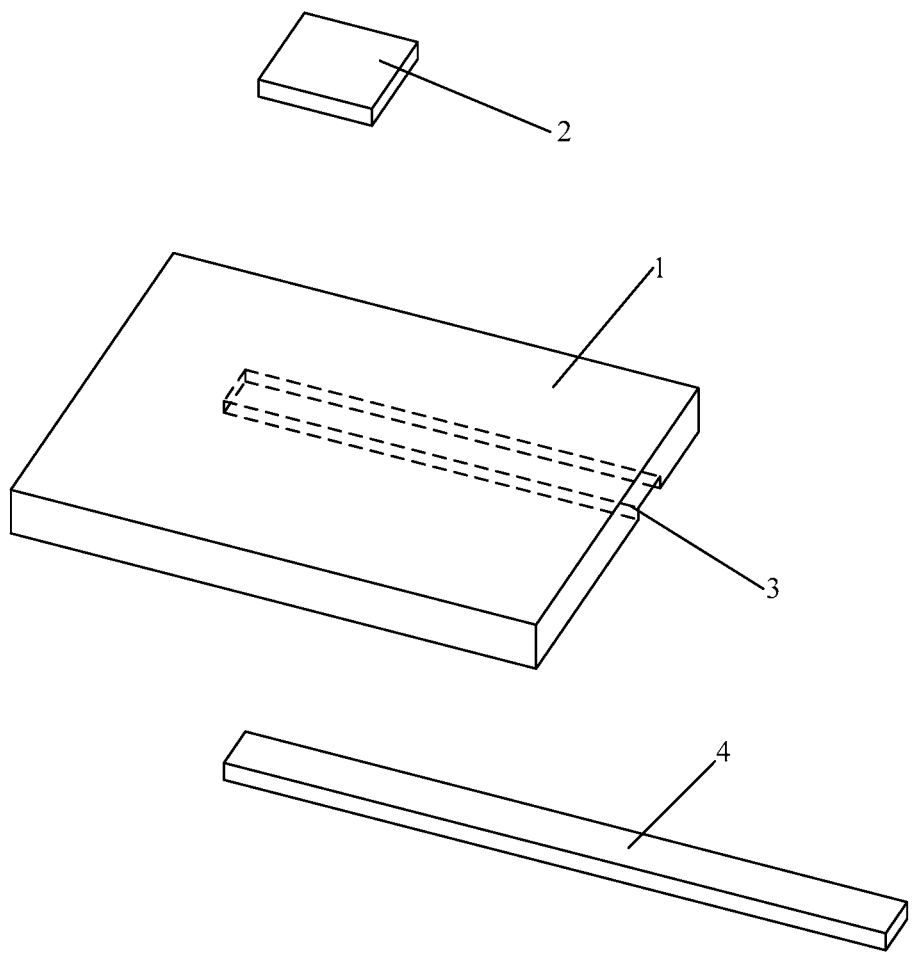
FIG. 3 is a first exploded view of FIG. 1 according to an embodiment of the present invention.
Figure 4:
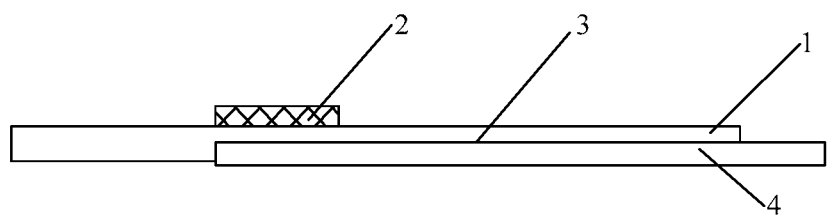
FIG. 4 is a first schematic sectional view taken along A-A' in FIG. 1 according to an embodiment of the present invention.

As shown in FIG. 1, FIG. 3 and FIG. 4, an embodiment of the present invention provides a mobile terminal, including a circuit board 1, where a chip 2 is disposed on a first surface of the circuit board 1, and a groove 3 is provided on a second surface of the circuit board 1. The mobile terminal further includes:

a heat pipe 4, where one end of the heat pipe 4 is embedded in the groove 3, and an other end protrudes from a side wall of the circuit board 1.

The heat pipe 4 makes use of evaporative cooling, so that temperatures of two ends of the heat pipe differ greatly and heat is conducted rapidly. The heat pipe generally consists of an envelope, a wick and end caps. An interior of the heat pipe is exhausted to a negative-pressure state and filled with a suitable liquid. Such a liquid has a low boiling point and is volatile. A pipe wall is provided with a wick that is made of a capillary porous material. The one end of the heat pipe 4 is an evaporation end, and the other end is a condensation end. When the one end of the heat pipe is heated, the liquid in capillary tubes evaporates rapidly. Vapor flows to the other end under a tiny pressure difference, releases heat and condenses into a liquid again. Then, the liquid flows back to the evaporation end along the porous material under action of capillary forces. As such circulation continues, the heat is transferred from the one end to the other end of the heat pipe 4. Because the circulation occurs rapidly, heat can be incessantly conducted to the outside.

Specifically, in this embodiment of the present invention, the chip 2 is disposed on the first surface of the circuit board 1, the groove 3 is provided on the second surface of the circuit board 1, the groove 3 extends to near the chip 2, the heat pipe 4 is disposed in the groove 3, and one end of the heat pipe 4 extends to outside the side wall of the circuit board 1. The heat pipe 4 can conduct heat generated by the chip 2 to an area with a relatively low temperature outside the circuit board 1, which effectively lowers a temperature around the chip 2, improves the heat dissipation efficiency of the chip 2, and lowers a temperature of the chip 2.

In addition, because the chip 2 is integrated with multiple electronic devices that enable the chip 2 to implement its functions, such as a MOS (Metal Oxide Semiconductor) transistor, when the temperature of the chip 2 rises, a leakage current from a source to a drain of the MOS transistor increases exponentially with the temperature, and power consumption of the chip 2 is increased. In this embodiment of the present invention, the heat dissipation efficiency of the chip 2 is improved, the temperature around the chip 2 is lowered, and the leakage current is reduced, which is equivalent to reducing the power consumption of the chip 2, thereby further reducing power consumption of the entire mobile terminal.

Figure 2:
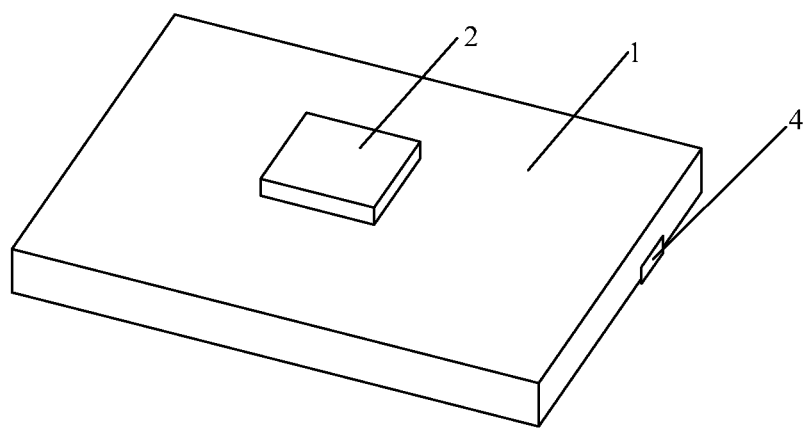
FIG. 2 is a second schematic diagram of an internal structure of a mobile terminal according to an embodiment of the present invention.

In addition, as shown in FIG. 2, in this embodiment of the present invention, the heat pipe 4 may extend only to the side wall of the circuit board 1. In this way, not only the temperature around the chip 2 can be lowered, but also a length of the mobile terminal can be shortened.

In the technical solution of this embodiment of the present invention, the chip is disposed on the first surface of the circuit board in the mobile terminal, the groove is provided on the second surface of the circuit board, the heat pipe is disposed in the groove, and one end of the heat pipe extends to the side wall of the circuit board or outside the side wall of the circuit board, so that heat generated by the chip can be conducted to the outside of the circuit board through the heat pipe. In this way, a temperature around the chip can be effectively lowered, thereby lowering a temperature of the entire mobile terminal. In addition, a leakage current is reduced, and power consumption of the chip is reduced, thereby further reducing power consumption of the entire mobile terminal.

As shown in FIG. 3, generally, a depth of the groove 3 is set according to an actual thickness of the circuit board 1. Because the thickness of the circuit board 1 generally ranges from 0.6 mm to 1 mm, the depth of the groove 3 should be less than or equal to half the thickness of the circuit board 1, in order to ensure strength and rigidity of the circuit board 1 provided with the groove 3.

A heat pipe 4 having a rectangular section, preferably a relatively oblate rectangular section, may be selected. In this case, the depth of the groove 3 cooperating with the heat pipe 4 can be relatively small, which can better ensure the strength and rigidity of the circuit board 1. In addition, a heat pipe having a relatively large width may be selected, which can ensure a heat dissipation effect of the chip 2.

However, because the current development trend is towards lighter and thinner mobile terminals, thicknesses of components inside mobile terminals also decrease correspondingly. If the thickness of the circuit board 1 is relatively small, there is a small difference between a thickness of the heat pipe 4 and the thickness of the circuit board 1. In this case, it still needs to be ensured that the depth of the groove 3 cooperating with the heat pipe 4 is less than or equal to half the thickness of the circuit board 1, and as shown in FIG. 1, FIG. 2 and FIG. 4, a part of the heat pipe protrudes from the second surface of the circuit board 1.

For example, a circuit board 1 of a mobile terminal has a thickness of 0.65 mm and is of a 10-layer board structure. A heat pipe 4 having a thickness of 0.5 mm and a length of 100 mm may be selected. Because a depth of a groove 3 in the circuit board 1 should not exceed half the thickness of the circuit board 1, the groove 3 may be formed on a second surface of the circuit board 1. The groove 3 has a depth of 0.2 mm and extends from a side wall of the circuit board 1 to a position, which corresponds to a chip 2, on the second surface. In this case, the heat pipe 4 protrudes from the second surface of the circuit board 1 by 0.3 mm.

In this embodiment of the present invention, the groove 3 may be formed by using a milling cutter machine, or be formed by using a laser method. It should be noted that the laser method is only applicable to a circuit board 1 that is not clad with copper, and a material that is not transmissive to a laser needs to be disposed between layers. For example, for the foregoing circuit board 1 of a 10-layer-board structure, if the groove 3 is formed only in the first to third layers of the structure by using a laser, a material that is not transmissive to a laser may be disposed between the third and fourth layers of the structure.

Figure 5:
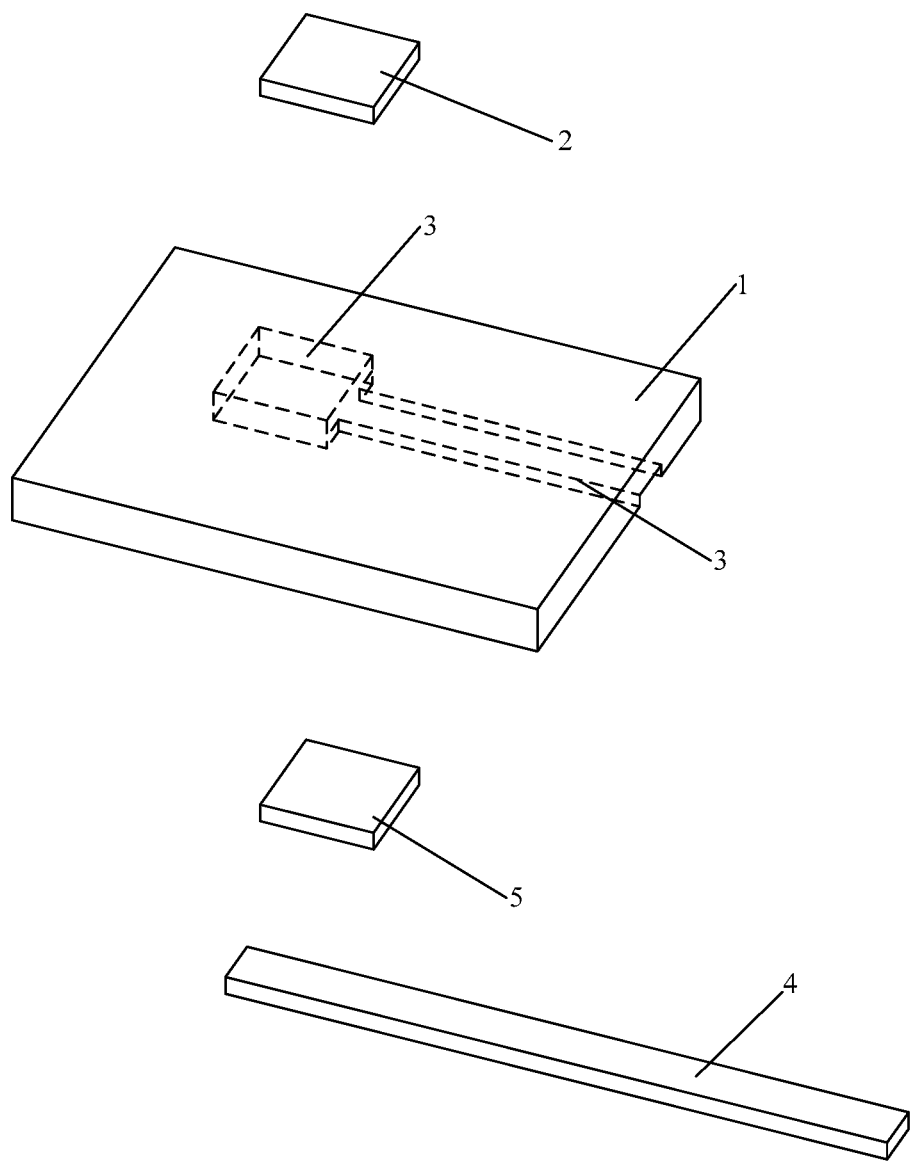
FIG. 5 is a second exploded view of FIG. 1 according to an embodiment of the present invention.
Figure 6:
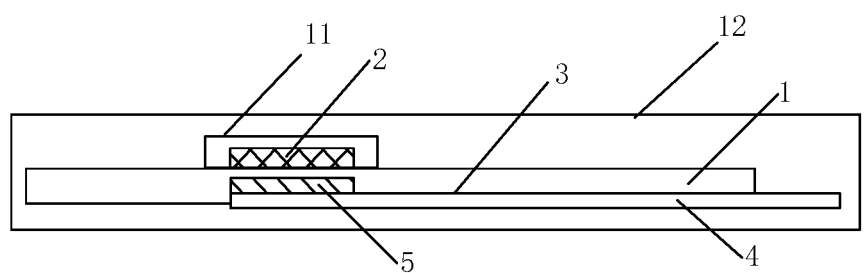
FIG. 6 is a second schematic sectional view taken along A-A' in FIG. 1 according to an embodiment of the present invention.

Further, as shown in FIG. 5 or FIG. 6, to improve the heat dissipation efficiency of the chip 2, the mobile terminal in the present invention may further include:

a thermal pad 5, located in the groove 3, where the thermal pad 5 is located between the chip 2 and the heat pipe 4.

It can be known by comparing FIG. 5 with FIG. 3 that to dispose the thermal pad 5, a space corresponding to the thermal pad 5 is formed in the groove 3.

The thermal pad 5 is made of a high-performance, thermally conductive gap-filling material, which is mainly used for a transfer interface between an electronic device and a heat sink or a housing of the electronic device, and has good stickiness, good flexibility, good compression performance and an excellent thermal conductivity.

In the technical solution of this embodiment of the present invention, as shown in FIG. 5 and FIG. 6, the thermal pad 5 is placed between the heat pipe 4 and the chip 2, to conduct heat from the chip 2 to the heat pipe 4, thereby further improving the heat dissipation efficiency of the chip 2 and lowering the temperature of the chip 2.

Further, as shown in FIG. 6, in the technical solution of this embodiment of the present invention, the mobile terminal further includes:

a shielding case 11, located on the circuit board 1 and wrapping the chip 2; and a structure such as a housing 12 that wraps the heat pipe 4, the shielding case 11, the chip 2, and the circuit board 1.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A mobile terminal, comprising a circuit board, wherein a chip is disposed on a first surface of the circuit board, a groove is provided on a second surface of the circuit board, and the mobile terminal further comprises:
    a heat pipe, wherein the heat pipe is disposed in the groove, and one end of the heat pipe extends to a side wall of the circuit board or outside a side wall of the circuit board; and
    a thermal pad, located in the groove, wherein the thermal pad is located between the chip and the heat pipe.

2. The mobile terminal according to claim 1, wherein the groove extends to below the chip.

3. The mobile terminal according to claim 1, wherein a depth of the groove is less than or equal to half a thickness of the circuit board.

4. The mobile terminal according to claim 1, wherein the heat pipe has a rectangular section.

5. The mobile terminal according to claim 1, further comprising:
    a shielding case, located on the circuit board and wrapping the chip.

6. The mobile terminal according to claim 1, further comprising:
    a housing, wrapping the heat pipe, the shielding case, the chip, and the circuit board.

7. A method, comprising:
    disposing a chip on a first surface of a circuit board in a mobile terminal;
    forming a groove on a second surface of the circuit board;
    disposing a heat pipe in the groove, wherein one end of the heat pipe extends to a side wall of the circuit board; and
    disposing a thermal pad in the groove, wherein the thermal pad is located between the chip and the heat pipe.

8. The method according to claim 1, wherein the groove extends to below the chip.

9. The method according to claim 1, wherein a depth of the groove is less than or equal to half a thickness of the circuit board.

10. The method according to claim 1, wherein the heat pipe has a rectangular section.

11. The method according to claim 1, further comprising:
    forming a shielding case, on the circuit board, wherein the shielding case wraps the chip.

12. The method according to claim 1, further comprising:
    forming a housing that wraps the heat pipe, the shielding case, the chip, and the circuit board.

* * * * *